(12) United States Patent
Sharma et al.

(10) Patent No.: US 11,329,615 B2
(45) Date of Patent: May 10, 2022

(54) BALANCED AMPLIFIER ARRANGEMENT FOR POWER CONTROL AND IMPROVED DEEP BACK-OFF EFFICIENCY

(71) Applicant: pSemi Corporation, San Diego, CA (US)

(72) Inventors: Vikas Sharma, Reading (GB); Peter Bacon, Derry, NH (US)

(73) Assignee: PSEMI CORPORATION, San Diego, CA (US)

(*) Notice: Subject to any disclaimer, the term of this patent is extended or adjusted under 35 U.S.C. 154(b) by 40 days.

(21) Appl. No.: 16/886,243

(22) Filed: May 28, 2020

(65) Prior Publication Data

US 2021/0376802 A1 Dec. 2, 2021

(51) Int. Cl.
*H03F 3/19* (2006.01)
*H03F 1/56* (2006.01)

(52) U.S. Cl.
CPC ............ *H03F 3/19* (2013.01); *H03F 1/56* (2013.01); *H03F 2200/222* (2013.01); *H03F 2200/387* (2013.01); *H03F 2200/451* (2013.01)

(58) Field of Classification Search
CPC ........ H03F 3/19; H03F 1/56; H03F 2200/222; H03F 2200/387; H03F 2200/451
USPC .......................................................... 330/295
See application file for complete search history.

(56) References Cited

U.S. PATENT DOCUMENTS

| | | | | |
|---|---|---|---|---|
| 4,398,161 A * | 8/1983 | Lamb | .......................... | H01P 1/18 333/156 |
| 5,610,556 A * | 3/1997 | Rubin | ...................... | H03F 3/602 330/124 R |
| 6,954,623 B2 * | 10/2005 | Chang | ...................... | H04B 5/06 455/127.1 |
| 7,876,160 B2 | 1/2011 | Zhang et al. | | |
| 2002/0190790 A1 * | 12/2002 | Cheng | ...................... | H03F 3/602 330/51 |
| 2008/0048774 A1 | 2/2008 | Chang et al. | | |
| 2008/0074735 A1 | 3/2008 | Bakalski et al. | | |

(Continued)

OTHER PUBLICATIONS

Intutorials by John, "Practical Power Amplifier Stages and Block Diagram", https://www.circuitstoday.com/practical-power-amplifier-stages-and-block-diagram (Year: 2021).*

(Continued)

*Primary Examiner* — Hafizur Rahman
(74) *Attorney, Agent, or Firm* — Steinfl + Bruno LLP

(57) ABSTRACT

Methods and apparatuses for providing a reduction in output power of a balanced amplifier configuration are presented. According to one aspect, reduction of the output power is provided by deactivating one of the two amplification paths of the balanced amplifier. According to another aspect, impedances seen at ports of input and output couplers of the balanced amplifier configuration part of a deactivated amplification path are selectively switched in dependence of operation according to the reduced output power or according to normal output power. In addition, or in the alternative, impedance seen at an isolated/terminated port of the input and/or the output coupler is selectively switched in dependence of the operation. When operating according to the reduced output power, values of the switched impedances can be adjusted to tune a frequency response of the balanced amplifier.

20 Claims, 14 Drawing Sheets

(56) References Cited

U.S. PATENT DOCUMENTS

| | | | |
|---|---|---|---|
| 2008/0180168 A1 | 7/2008 | Itkin et al. | |
| 2014/0232589 A1* | 8/2014 | Trotta | G01S 7/285 342/368 |
| 2015/0091668 A1* | 4/2015 | Solomko | H01P 5/18 333/111 |
| 2015/0188504 A1 | 7/2015 | åkesson | |
| 2019/0341960 A1* | 11/2019 | Pal | H04J 3/02 |

OTHER PUBLICATIONS

Electronics Coach All About Electronics, "Power Amplifier", https://electronicscoach.com/power-amplifier.html (Year: 2021).*

International Search Report issued for International PCT Application No. PCT/US2021/033464 filed on May 20, 2021, on behalf of pSemi Corporation. dated Sep. 15, 2021. 3 Pages.

Written Opinion issued for International PCT Application No. PCT/US2021/033464 filed on May 20, 2021, on behalf of pSemi Corporation. dated Sep. 15, 2021. 5 Pages.

* cited by examiner

BALANCED AMPLIFIER ARRANGEMENT FOR POWER CONTROL AND IMPROVED DEEP BACK-OFF EFFICIENCY

TECHNICAL FIELD

The present teachings relate to radio frequency (RF) circuits. More particularly, the present teachings relate to methods and apparatuses for power control with improved efficiency of balanced amplifiers operating in power back-off conditions.

BACKGROUND

FIG. 1A shows a simplified bock diagram of a prior art balanced amplifier (100A) that can be used, for example, in a radio frequency (RF) transmit path of an RF system. The balanced amplifier (100A) is configured to amplify an input RF signal, $RF_{IN}$, to generate therefrom an amplified version of the input RF signal, $RF_{OUT}$, which can be used for transmission via, for example, an antenna (150) of the RF system. As shown in FIG. 1A, amplification of the $RF_{IN}$ signal may be provided via separate amplification paths (shown in the figure as a solid path and a dashed path) of the balanced amplifier (100A), each such amplification path comprising respective (single-ended) amplifiers (130a, 130b) that may operate on phase-shifted versions of the $RF_{IN}$ signal. For example, the amplifiers (130a, 130b) may operate in quadrature (i.e., 90 degrees apart), or in other words, they process/amplify RF signals of (substantially) same power but in quadrature phase.

As shown in FIG. 1A, an input coupler (110) (e.g., a quadrature coupler, a branch-line coupler, etc.) of the balanced amplifier (100A) splits the input RF signal, $RF_{IN}$, provided at a (input) port P1 of the input coupler (110), to two quadrature signals (i.e., 90 degrees apart) of substantially same power (e.g., amplitude) at respective (output) ports P3 and P2. The split quadrature signals at the ports (P3, P2) of the input coupler (110) are fed to the respective amplifiers (130a, 130b) for amplification and output to respective (input) ports (P2, P3) of an output coupler (120). In turn, the output coupler (120) constructively combines the two phase-shifted (quadrature) signals provided at the ports (P2, P3) of the output coupler (120) to generate therefrom a combined output RF signal, $RF_{OUT}$, at a (output) port P1 of the output coupler (120). Accordingly, the RF signal, $RF_{OUT}$, output by the balanced amplifier (100A) has a power that is substantially equal to the power of the RF signal, $RF_{IN}$, input to the balanced amplifier (100A) multiplied by the gain of the amplifier (e.g., gain of the amplifiers 130a, 130b).

A person skilled in the art knows the performance advantages of using balanced amplifiers, such as one shown in FIG. 1A, in a transmit path (and/or receive path) of an RF system, such benefits including, for example, higher power handling, and higher immunity with respect to VSWR (voltage standing wave ratio) performance due to, for example, reduced losses to reflections arising from mismatched amplifiers used in single-ended configurations. Such increased tolerance to VSWR provided by balanced amplifiers makes such amplifiers an ideal choice for, for example, mobile handsets, to counter effects of antenna impedance variations due to different user hand-holdings of such handsets. Increased VSWR tolerances provided by such balanced amplifiers can also advantageously be used, for example, in base stations used for beamforming applications (e.g., millimeter wave 5G) wherein antenna impedance provided via elements of a phase array to individual amplifiers participating in the beamforming can drastically vary.

The higher power handling that is inherent to the combining of the two (quadrature) amplified RF signals of the balanced amplifier (e.g., 100A of FIG. 1A) allows for even higher output power (e.g., 3 dB or higher), and therefore makes balanced amplifiers an ideal choice in applications where amplifiers are required to operate in power back-off conditions due to, for example, increased linearity demands. One such application is millimeter wave 5G, wherein corresponding wideband complex modulation schemes require amplifier linearity performances that can only be achieved when the amplifiers operate in power back-off conditions. As known to a person skilled in the art, amplifiers operating in power back-off conditions are less efficient (dissipate more power) and therefore generate more heat. Accordingly, cumulative effect of operating amplifiers participating in the beamforming (e.g., for millimeter wave 5G applications) in respective power back-off conditions can drastically reduce system efficiency and produce undesired thermal challenges.

In some applications, such as for example 5G New Radio (NR), it is envisioned to reduce power output by the amplifiers (e.g., 6 dB or lower) when higher power is not needed. In turn, it is desired that such reduction of output power can decrease overall power dissipation and therefore address some of the related thermal challenges discussed above. When using a balanced amplifier, such as one shown in FIG. 1A, a reduction of output power may be provided by a corresponding reduction of an input RF power (e.g., RF amplitude) to the amplifier (e.g., amplifier of $RF_{IN}$ signal). However, reducing the input RF power to the balanced amplifier does not affect a DC power through each of the single-ended amplifiers (e.g., 130a, 130b of FIG. 1A), and therefore does not substantially affect efficiency of the balanced amplifier.

Teaching according to the present disclosure allow for reduction of the DC power in a balanced amplifier configuration when operating at a reduced power and therefore allow for increased efficiency of the balanced amplifier when operating at the reduced power.

SUMMARY

According to a first aspect of the present disclosure, an amplifier arrangement configured to operate according to a first mode of operation and a second mode of operation is presented, the amplifier arrangement comprising: a first amplifier comprising an input and an output; a second amplifier comprising an input and an output; an input coupler comprising an input port, an input terminated port, and respective amplifier input ports coupled to respective inputs of the first and the second amplifier; an output coupler comprising an output port, an output terminated port, and respective amplifier output ports coupled to respective outputs of the first and the second amplifier; wherein during the first mode of operation: the first and the second amplifiers are activated and the amplifier arrangement is configured to operate as a balanced amplifier for amplification of an input RF signal provided at the input port of the input coupler and generation therefrom of an output RF signal provided at the output port of the output coupler, and wherein during the second mode of operation: one of the first and second amplifiers is deactivated and the other one of the first and second amplifiers is activated, and the amplifier arrangement is configured to operate as a single-ended amplifier for amplification of the input RF signal provided at the input port of the input coupler via the activated amplifier and generation therefrom of the output RF signal provided at the output port of the output coupler, and an impedance coupled to a switching impedance port of the input or output coupler is adjusted, the switching impedance port comprising one of: the input or output terminated port, or the respective amplifier input port or the respective amplifier output port associated with the deactivated amplifier.

According to second aspect of the present disclosure, a method for reducing output power of a balanced amplifier is presented, the method comprising: providing a balanced amplifier comprising an input coupler and an output coupler coupled to respective inputs and outputs of a first and a second amplifier; coupling at least one switching impedance circuit to a port of the input or output coupler; deactivating one of the first or second amplifiers for reducing output power, thereby providing amplification based on an activated amplifier of the first and the second amplifiers; and based on the coupling and the deactivating, tuning a frequency response of the amplification by adjusting an impedance value coupled to said port of the input or output coupler.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios, base stations, etc.) having a plurality of devices, such as for example, transistors (e.g., MOSFETs). Persons skilled in the art will appreciate that such electrical circuits comprising transistors can be arranged as amplifiers.

As used herein, the expression "operating frequency" can refer to a frequency of a signal being input to a device (such as an amplifier).

As used herein, the expression "center frequency" can refer to a reference frequency about which the operating frequency varies. The center frequency may be, for example, associated to a band or channel of operation of an RF communication system, and the operating frequency may be associated to a bandwidth of the band or channel of operation.

Figure 1A:
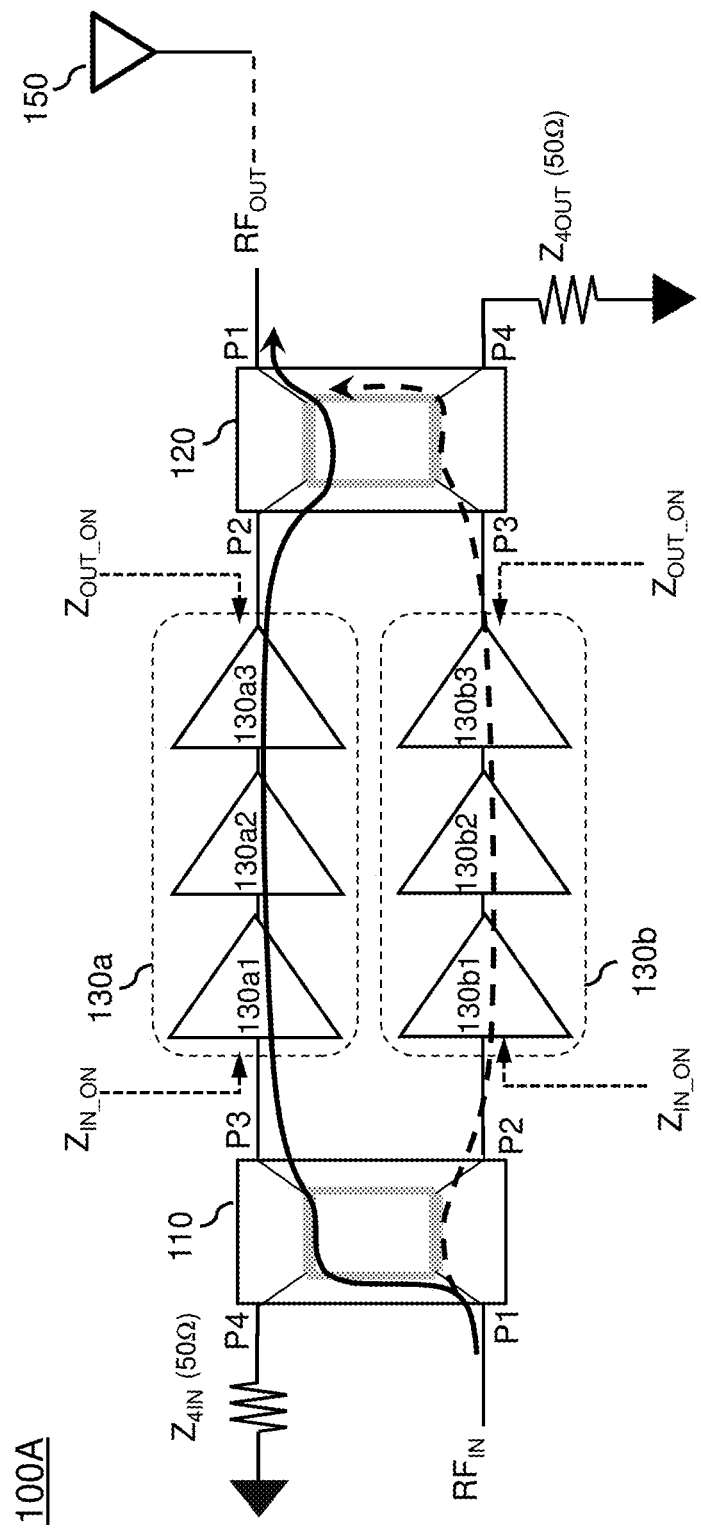
FIG. 1A shows a simplified bock diagram of a prior art balanced amplifier comprising input and output couplers.
Figure 1B:
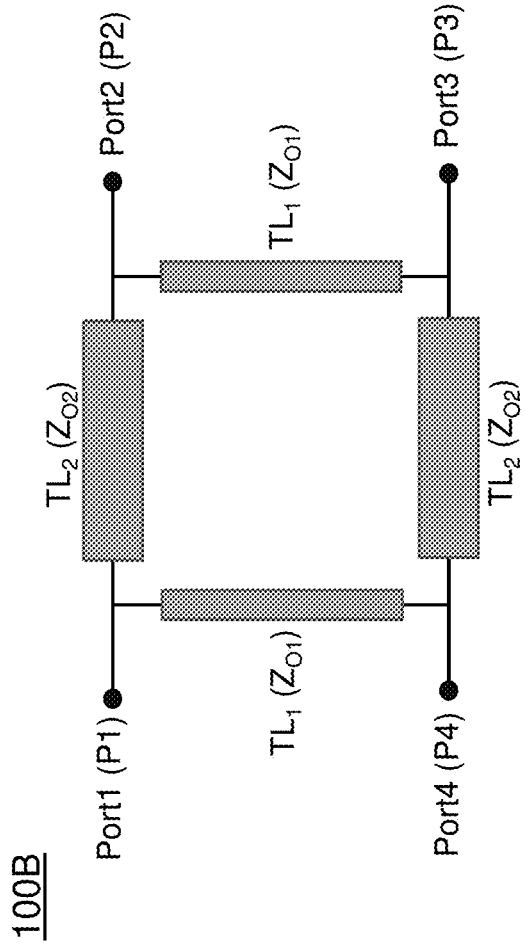
FIG. 1B shows exemplary internal configuration of a coupler that can be used in the balanced amplifier of FIG. 1A.

FIG. 1B shows exemplary internal configuration of a prior art coupler (100B) that can be used, for example, in the balanced amplifier of FIG. 1A, as any of the couplers (110) and/or (120). As can be seen in FIG. 1B, the coupler (100B) is a 4-port network comprising respective ports P1, P2, P3 and P4 (also labeled as Port1, Port2, Port3 and Port4 in FIG. 1B), wherein any two such ports are coupled to one another via a respective transmission line $TL_1$ and $TL_2$, having a respective characteristic impedance $Z_{O1}$ and $Z_{O2}$. As known to a person skilled in the art, the transmission lines $TL_1$ and $TL_2$ are designed to provide the respective characteristic impedances $Z_{O1}$ and $Z_{O2}$ based on a target system impedance ($Z_O$), such as, for example, $Z_O=50$ Ohms. For example, in some embodiments, $Z_{O1}=Z_O$ and $Z_{O2}=0.707 \times Z_O$ (e.g., for equal power splitting).

As known to a person skilled in the art, the coupler (100B) shown in FIG. 1B can nominally be used to either divide/split an RF signal at the port P1 to two substantially equal power and out of phase (e.g., quadrature phase) RF signals at respective ports P2 and P3, or combine two substantially equal power and out of phase (e.g., quadrature phase) RF signals at respective ports P2 and P3 to a single RF signal at port P1. Such nominal modes of operation (e.g., split and combine) of the coupler (100B) may be based on a termination impedance provided at the port P4 that is configured to "isolate" such port from any RF signal flowing through the coupler. As known to a person skilled in the art, such termination impedance may be equal to the system impedance, $Z_O$. Furthermore, it should be noted that a ratio of the power splitting (e.g., ratio of powers between P2 and P3) provided by the coupler (100B) may not necessarily be an equal ratio (e.g., 50/50) and may be based on relative values of the respective characteristic impedances $Z_{O1}$ and $Z_{O2}$. As known to a person skilled in the art, a desired magnitude of the power ratio, pRatio_mag, may be provided by designing the transmission lines $TL_1$ and $TL_2$ to have respective impedances $Z_{O1}=Z_O*pRatio\_mag\hat{~}0.5$ and $Z_{O2}=Z_O*(pRatio\_mag/(1+pRatio\_mag))\hat{~}0.5$. In other words, operation of the balanced amplifier of FIG. 1A may be based on couplers (110, 120) having a power splitting which is not necessarily an equal power (e.g., 50/50).

Figure 1C:
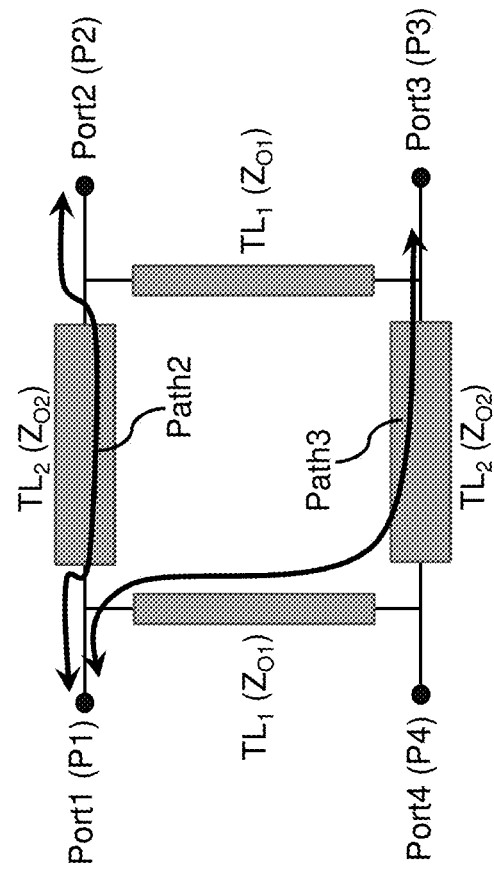
FIG. 1C shows two internal conduction paths of the coupler shown in FIG. 1B based on a nominal operation of the coupler.

Accordingly, as shown in FIG. 1C, during such nominal modes of operation, two separate internal conduction paths, Path2 and Path3, are provided by the coupler (100B), wherein Path2 provides conduction between port P1 and port P2, and Path3 provides conduction between port P1 and port P3. For example, splitting an RF signal at port P1 into ports P2 and P3 is provided by the Path 2 established between port P1 and port P2, and the Path 3 established between port P1 and port P3. Likewise, combining RF signals at ports P2 and P3 into port P1 is provided by the Path 2 established between port P2 and port P1, and the Path 3 established between port P3 and port P1. In other words, each of the paths Path2 and Path3 can operate bidirectionally.

With reference back to the prior art configuration of FIG. 1A, it can be seen that a first portion (e.g., half of the power) of the $RF_{IN}$ signal at port P1 of the input coupler (110) flows through Path3 of the coupler (110), through the (single-ended) amplifier (130a) for amplification, and through Path2 of the output coupler (120) for output (and combining) at the port P1 of the output coupler (120). Likewise, a second portion (e.g., half of the power) of the $RF_{IN}$ signal at port P1 of the input coupler (110) flows through Path2 of the coupler (110), through the (single-ended) amplifier (130b), and through Path3 of the output coupler (120) for output (and combining) at the port P1 of the output coupler (120). Accordingly, in the prior art configuration shown in FIG. 1A, ports P2 and P3 of either couplers (110, 120) are used as coupling ports to (differential) input or output of the amplifiers (130a, 130b), port P1 is used as either input or output of the balanced amplifier, and port P4 is used as the terminating port (coupled to a terminating impedance).

It should be noted that the above description is based on nominal usage of the coupler (100B) according to a configuration wherein the ports P2 and P3 are essentially isolated from one another. As known to a person skilled in the art, isolation between ports P2 and P3 is achieved by the coupler structure that provides a cancelation behavior of signals traveling through two distinct signal paths between ports P2 and P3, each signal path provided by one or more of the transmission lines (sections) of the coupler structure as shown in FIG. 1B. Such coupler structure provides 90 degree phase for each section of each signal path, the section based on one transmission line of the coupler structure. For example, for a signal entering at port P2, the signal travels through two different transmission paths to port P3. One transmission path that passes through a single transmission line (e.g., $TL_1$ between ports P2 and P3) incurs a 90 degree phase offset, while the second transmission path that passes through three transmission lines (e.g., $TL_2$, $TL_1$, $TL_2$ between ports P2 and P1, P1 and P4, and P4 and P3) incurs a 270 degree phase offset. The summation of signals through the two transmission paths at port P3 results in near perfect cancellation at the center frequency.

Teachings according to the present disclosure configure the coupler (100B) for a "degenerative" usage, or "degenerative mode", or "degenerative mode of operation", wherein an impedance that is coupled to one of the two ports P2 or P3 that is OFF (e.g., OFF port) is used to force the conduction path away from the OFF port and towards the other one of the two ports P2 and P3 that is active (e.g., ON port). Such degenerative mode of operation according to the present disclosure is provided by careful configuration of impedances seen at ports P2 or P3 (e.g., OFF port) so as to optimize signal transfer from port P1 to port P3 or P2 (e.g., ON port), respectively. Furthermore, such degenerative mode of operation according to the present disclosure may configure the impedance coupled at the port P4 in view of the impedances at ports P2 or P3. According to an exemplary embodiment of the present disclosure, a magnitude of the impedance seen at port P4 may be proportional to a magnitude of the impedance seen at port P3 when the degenerative mode of operation diverts a signal path from port P3 towards port P2 (e.g., FIG. 1E). According to another exemplary embodiment of the present disclosure, a magnitude of the impedance seen at port P4 may be inversely proportional to a magnitude of the impedance seen at port P2 when the degenerative mode of operation diverts a signal path from port P2 towards port P3 (e.g., FIG. 1D). During normal, non-degenerative operation of the balanced amplifier of FIG. 1A, the input coupler (110) and output coupler (120) have their respective ports, port P2 and port P3, impedances provided by the respective input impedance (shown in FIG. 1A as $Z_{IN\_ON}$) and output impedance (shown in FIG. 1A as $Z_{OUT\_ON}$) of the amplifiers (130a, 130b) during operation (active state) of the amplifiers.

Figure 1D:
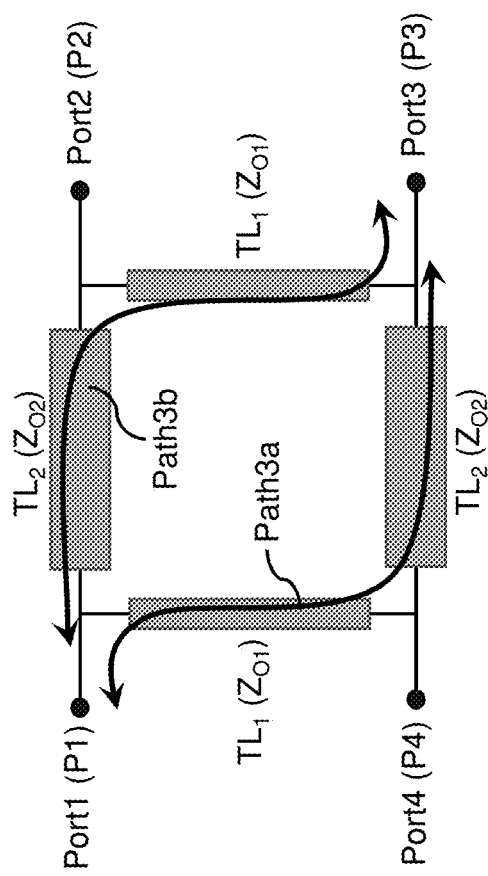
FIG. 1D shows two internal conduction paths of the coupler shown in FIG. 1B based on a first degenerative operation of the coupler.

FIG. 1D shows two internal conduction paths, Path3a and Path3b, of the coupler shown in FIG. 1B based on a first degenerative (mode of) operation of the coupler (100B), wherein a first portion of a signal provided at the port P1 is conducted, through the conduction path, Path3b, from the port P1 to the port P2 and then diverted for output (and combining) at the port P3; and a second portion of the signal provided at the port P1 is conducted, through the conduction path, Path3a that is parallel to Path3b, from the port P1, through the port P4 for output (and combining) at the port P3. A person skilled in the art would clearly understand that the second portion of the signal flows through a path (e.g., Path3a) similar to one described with respect to FIG. 1C, whereas the first portion flows through the Path3b that includes an extra transmission line (e.g., $TL_1$) arranged between ports P2 and P3. As noted above, a combination of impedances seen at ports P2 and P4 may provide for the signal paths shown in FIG. 1D. Because both signal paths, Path3a and Path3b, shown in FIG. 1D provide conduction between ports P1 and P3, the combined signal paths may be referred to, in the present disclosure, as a Path3 conduction path that as noted above is provided via a degenerative operation of the coupler (100B), such as Path3=Path3a//Path3b (in parallel configuration).

Figure 1E:
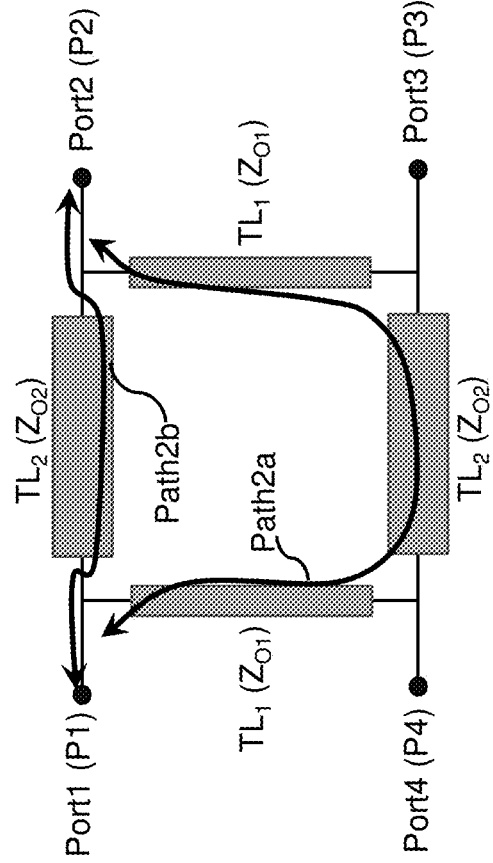
FIG. 1E shows two internal conduction paths of the coupler shown in FIG. 1B based on a second degenerative operation of the coupler.

FIG. 1E shows two internal conduction paths, Path2a and Path2b, of the coupler shown in FIG. 1B based on a second degenerative (mode of) operation of the coupler (100B), wherein a first portion of a signal provided at the port P1 is conducted, through the conduction path, Path2b, from the port P1 to the port P2, and a second portion of the signal provided at the port P1 is conducted, through the conduction path, Path2a that is parallel to Path2b, from the port P1, through the port P4 and to port P3, and then diverted for output (and combining) at the port P2. A person skilled in the art would clearly understand that the first portion of the signal flows through a path (e.g., Path2b) similar to one described with respect to FIG. 1C, whereas the second portion flows through the Path2a that includes an extra transmission line (e.g., TL$_1$) arranged between ports P3 and P2. As noted above, a combination of impedances seen at ports P3 and P4 may provide for the signal paths shown in FIG. 1E. Because both signal paths shown in FIG. 1E provide conduction between ports P1 and P2, the combined signal paths may be referred to, in the present disclosure, as a Path2 conduction path, that as noted above is provided via a degenerative operation of the coupler (100B), such as Path2=Path2a//Path2b (in parallel configuration).

Figure 2A:
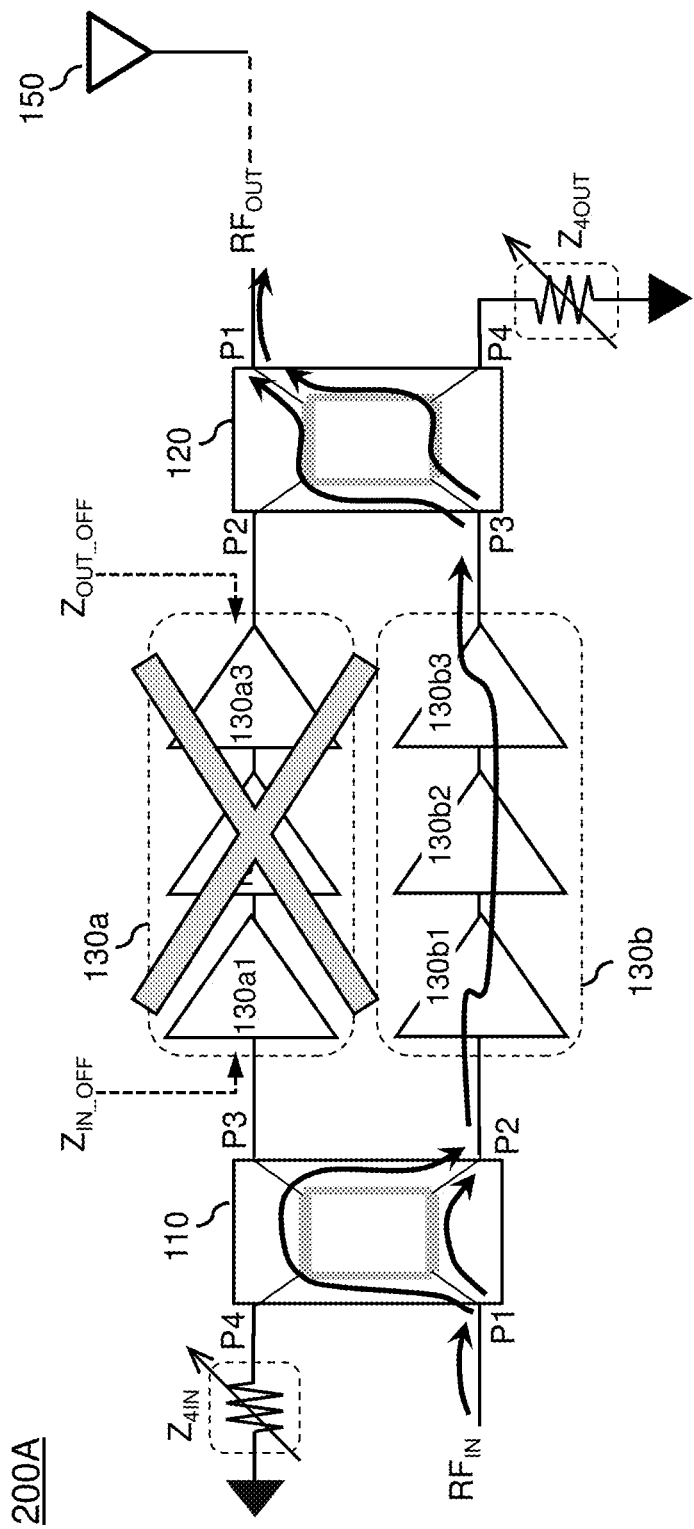
FIG. 2A shows a simplified bock diagram of a balanced amplifier according to an exemplary embodiment of the present disclosure for providing a reduced output power via a deactivated amplification path.

FIG. 2A shows a simplified bock diagram of a balanced amplifier (200A) according to an exemplary embodiment of the present disclosure for providing a reduced output power via a deactivated amplification path (e.g., 130a). As can be clearly understood by a person skilled in the art, the balanced amplifier (200A) has similar elements as ones described above with respect to the configuration shown in FIG. 1A, with some exceptions, including impedances seen at various ports of the input coupler (110) and the output coupler (120) intended for (selective) operation of such couplers according to a degenerative mode of operation described above with respect to FIG. 1D and FIG. 1E when the amplifier (200A) operates at reduced output power. For example, as shown in FIG. 2A, during operation at reduced output power, impedances $Z_{4IN}$ at port P4 and $Z_{IN\_OFF}$ at port P3 of the input coupler (110), as well as impedances $Z_{4OUT}$ at port P4 and $Z_{OUT\_OFF}$ at port P2 of the output coupler (120) may be selectively configured/adjusted.

During a normal (higher output power) operation of the balanced amplifier (200A) of FIG. 2A, amplification is based on a same principle of operation as described above with reference to the configuration shown in FIG. 1A. In other words, during operation for higher output power, the input RF signal, $RF_{IN}$, is split by the input coupler (110) into out of phase (e.g., quadrature phase) RF signals, each of the quadrature RF signals amplified via an amplifier (e.g., 130a, 130b) of a corresponding amplification path, each amplified quadrature RF signal output to respective ports of the output coupler (120) for (constructive) quadrature re-combining to generate the amplified output RF signal, $RF_{OUT}$, at the output port P1 of the output coupler (120). Accordingly, the input RF signal, $RF_{IN}$, is coupled to respective inputs of amplifiers (130a, 130b) via respective Path3 and Path2 of the input coupler (110), and respective outputs of the amplifiers (130a, 130b) are coupled to respective Path2 and Path3 of the output coupler (120), while ports P2 and P3 of the input coupler (110) and of the output coupler (120) remain substantially isolated.

On the other hand, during a reduced power (reduced output power) operation of the balanced amplifier (200A) of FIG. 2A, the amplifier (130) of one of the amplification paths (e.g., top amplification path 130a) is deactivated and the input and output couplers (110, 120) are configured for operation according to a degenerative mode described above with reference to FIG. 1D and FIG. 1E. For example, the input coupler (110) can be configured for operation according to the Path2 of the second degenerative mode shown in FIG. 1E, wherein an impedance at (i.e., coupled to) the port P3 of the input coupler (110) corresponding to an input of the deactivated amplifier (130a), is modified (from a nominal value defined by an active state impedance) to provide a (substantial) coupling between port P3 and the port P2 of the input coupler (110). Likewise, the output coupler (120) can be configured for operation according to the Path3 of the first degenerative mode shown in FIG. 1C, wherein an impedance at the port P2 of the output coupler (120) corresponding to an output of the deactivated amplifier (130a), is modified (from a nominal value) to provide a (substantial) coupling between port P2 and the port P3 of the output coupler (120). It should be noted that although in a practical implementation there may exist some level of coupling between ports P2 and P3 during a nominal operation of the coupler (e.g., per FIG. 1C), a level of coupling between such ports during the degenerative mode of the coupler (e.g., per FIGS. 1D and 1E) is substantially higher magnitude and at a level that is measurable (e.g., via insertion loss measurement) and provides considerable differentiation between operation in the two modes (nominal vs. degenerative). It should be noted that as clearly understood by a person skilled in the art, during the reduced power operation, the configuration shown in FIG. 2A does not operate in a balanced configuration, and therefore some advantages provided by such balances configuration may be lost in favor of advantages provided by the reduced (DC) power operation.

With continued reference to FIG. 2A, because ports P2 and P3 of the input/output couplers (110, 120) are used for coupling to the amplifiers (130a) and (130b), in the present disclosure such ports P2 and P3 may be respectively referred to as Amplifier_A-port and Amplifier_B-port of a coupler. Likewise, because port P1 is used for coupling of the input $RF_{IN}$ signal or the output $RF_{OUT}$ signal, in the present disclosure such port may be referred to as Input_port or Output_port of a coupler. Finally, the port P4 used to provide a termination impedance to the input/output couplers (110, 120) may be arbitrarily referred to in the present disclosure as isolated/terminated port of a coupler. Using such definitions, and with continued reference to FIG. 2A, the $RF_{IN}$ signal and the $RF_{OUT}$ signals are respectively fed to the Input_Port of the input coupler (110) and received from the Output_Port of the output coupler (120). The isolated/terminated ports of the input coupler (110) and the output coupler (120) are respectively coupled to an adjustable impedance $Z4_{IN}$ and $Z4_{OUT}$ that is configured to selectively provide an impedance value according to a mode of operation (normal power or reduced power) of the balanced amplifier (200A). Amplifier_B-port and Amplifier_A-port of the input coupler (110) are respectively coupled to an input of the amplifier (130a) and an input of the amplifier (130b), and Amplifier_A-port and Amplifier_B-port of the output coupler (120) are respectively coupled to an output of the amplifier (130a) and an output of the amplifier (130b).

With continued reference to FIG. 2A, deactivation of the amplifier (130a) during operation according to the reduced power, may include reduction of a DC power through the amplifier (130a) and therefore, as clearly understood by a person skilled in the art, may generate an effective reduction in dissipated power through the amplifier (i.e., associated with a reduction in a bias DC current through the amplifier). As known to a person skilled in the art, and shown in FIG. 1A and FIG. 2A, the amplifiers (130a, 130b) may each be an amplifier module that includes one or more cascaded amplifiers (stages) having various amplification levels. For example, each of the amplifiers (130a, 130b) may include a plurality of cascaded stages, such as, for example, three cascaded stages (e.g., (130a1, 130a2, 130a3) and (130b1, 130b2, 130b3) shown in FIG. 2A, also referred to as, for example, an input stage, an intermediate stage, and a final stage), wherein amplification provided by each such stage may be based on a DC current (e.g., bias current) through such stage based on, for example, a DC supply coupled to the stage, as shown in FIGS. 3A, 3B and 3C.

According to an exemplary embodiment of the present disclosure, deactivation of an amplifier used in the configuration of FIG. 2A, such as, for example, deactivation of the amplifier (130a), may include deactivating one, or more, or all of the amplification stages of the amplifier, wherein deactivation of one stage comprises of removing a DC current flow through the stage, such as, for example, removing DC power to the stage. Accordingly, total DC power through the amplifier (e.g., 130a) is reduced (case where not all stages are deactivated) or nulled (case where all stages are deactivated). FIGS. 3A, 3B and 3C show some exemplary configurations for activating/deactivating the amplifier (130a) shown in FIG. 2A via switches (e.g., $SW_1$, $SW_2$, $SW_3$, $SW_{130}$) that can selectively couple/decouple one or more stages of the amplifier to/from a supply power, thereby removing a DC current flow through the amplifier. It should be noted that deactivating of the amplifier (130a) can be provided by deactivating at least one stage (e.g., 130a1, 130a2, 130a3) of the amplifier (130a), whereas activating of the amplifier (130a) requires that all such stages be activated.

Figure 3A:
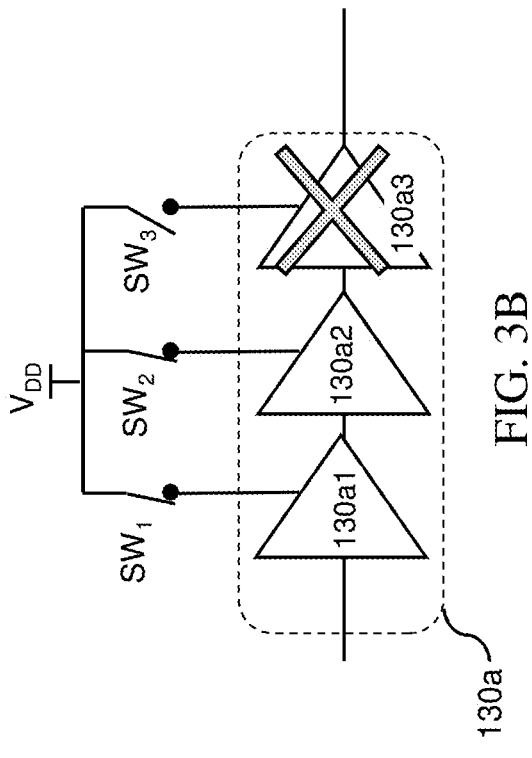
FIGS. 3A, 3B and 3C show various exemplary configurations according to the present disclosure for turning OFF one or more amplification elements of a deactivated amplification path.
Figure 3B:
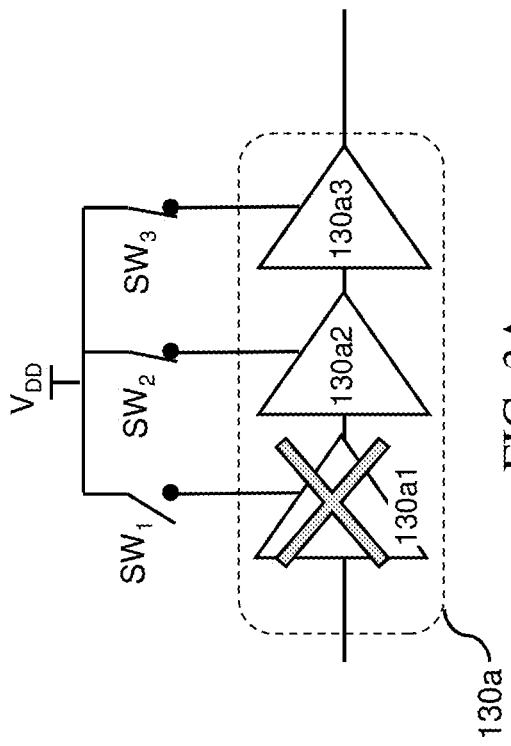

With reference to FIG. 3A and FIG. 3B, such figures show an exemplary configuration wherein each of the stages (130a1, 130a2, 130a3) of the amplifier (130a) is coupled to a supply power, $V_{DD}$, via a respective switch ($SW_1$, $SW_2$, $SW_3$). Accordingly, the configurations shown in FIG. 3A and FIG. 3B allow for selective activation and deactivation of each stage of the amplifier (130a). As shown in FIG. 3A, the input stage (130a1) is deactivated by opening switch $SW_1$, while the intermediate stage (130a2) and the output stage (130a3) remain activated (switches $SW_2$ and $SW_3$ closed). According to an exemplary embodiment of the present disclosure, deactivation of the amplifier (130a) shown in the configuration of FIG. 2A can include deactivation according to FIG. 3A or FIG. 3B. Accordingly, in both the activated, and deactivated according to FIG. 3A, conditions of the amplifier (130a), the impedance $Z_{OUT\_OFF}$ presented to the port P2 of the output coupler (120) may remain unchanged and provided by the output stage (130a3) of the amplifier (130). Likewise, in both the activated, and deactivated according to FIG. 3B, conditions of the amplifier (130a), the impedance $Z_{IN\_OFF}$ presented to the port P3 of the input coupler (110) may remain unchanged and provided by the input stage (130a1) of the amplifier (130a). Although not shown in the figures, deactivation of the amplifier (130a) may also include, for example, deactivation of the intermediate stage (130a2) while leaving the other two stages (130a1, 130a3) activated such as to present a same impedance to the couplers (110, 120) in both activated and deactivated conditions of the amplifier (130a).

Figure 3C:
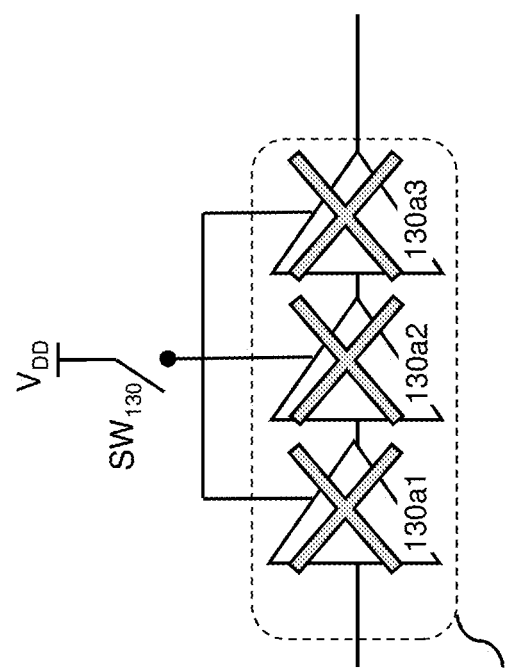

With reference to FIG. 3C, such figure shows an exemplary configuration wherein each of the stages (130a1, 130a2, 130a3) of the amplifier (130a) is coupled to a supply power, $V_{DD}$, via a single (global) switch ($SW_{130}$). Accordingly, the configuration shown in FIG. 3C does not allow for selective activation and deactivation of each stage of the amplifier (130a), rather for a global activation and deactivation of the amplifier (130a) wherein all of the stages are either activated or deactivated. According to an exemplary embodiment of the present disclosure, deactivation of the amplifier (130a) shown in the configuration of FIG. 2A can include deactivation according to FIG. 3C. Accordingly, when the amplifier (130a) is deactivated according to FIG. 3C, the impedances $Z_{OUT\_OFF}$ and $Z_{IN\_OFF}$ presented to the respective ports P2 of the output coupler (120) and P3 of the input coupler (110) by the amplifier (130a) changes when compared to the impedance presented to the same ports when the amplifier (130a) is active (i.e., activated). As will be described later with respect to FIGS. 4A. 4B and 4C, teachings according to the present disclosure allow selective switching of impedance values at any one of the ports P2 and/or P3 (e.g., Amplifier_A-port and/or Amplifier_B-port) that would otherwise be coupled to a deactivated amplifier (e.g., 130a). In other words, with reference to FIG. 2A, teachings according to the present disclosure allow selective setting of the impedances $Z_{IN\_OFF}$ and $Z_{OUT\_OUT}$ for operation of the input and output couplers (110, 120) according to the degenerative modes described above with reference to FIG. 1D and FIG. 1E.

Figure 2B:
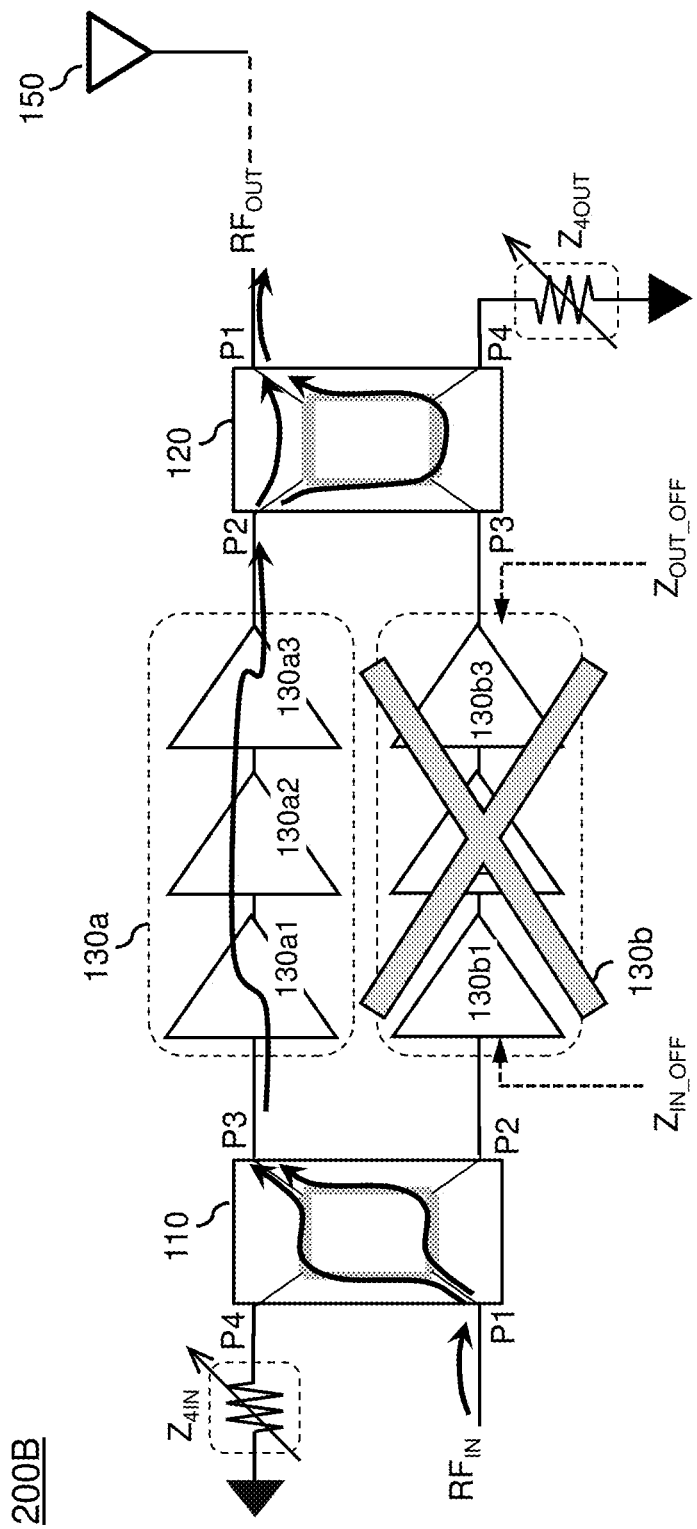
FIG. 2B shows a simplified bock diagram of a balanced amplifier according to another exemplary embodiment of the present disclosure for providing a reduced output power via a deactivated amplification path.

FIG. 2B shows a simplified bock diagram of a balanced amplifier (200B) according to an exemplary embodiment of the present disclosure for providing a reduced output power via a deactivated amplification path (e.g., 130b). As can be clearly understood by a person skilled in the art, the configuration shown in FIG. 2B can be considered as the dual of the configuration shown in FIG. 2A, wherein the reduced output power is provided via deactivating of the amplifier (130b) instead of the amplifier (130a). Accordingly, impedances seen at various ports of the input coupler (110) and the output coupler (120) are intended for (selective) operation of such couplers according to a degenerative mode of operation described above with respect to FIG. 1D and FIG. 1E when the amplifier (200B) operates at reduced output power. For example, as shown in FIG. 2B, during operation at reduced output power, impedances $Z_{4IN}$ at port P4 and $Z_{IN\_OFF}$ at port P2 of the input coupler (110), as well as impedances $Z_{4OUT}$ at port P4 and $Z_{OUT\_OFF}$ at port P3 of the output coupler (120) may be selectively configured/adjusted. A person skilled in the art would clearly understand principle of operation of the configuration shown in FIG. 2B based on the above description with reference to FIG. 2A as well as FIGS. 3A, 3B and 3C. In particular, the person skilled in the art would clearly understand that during the reduced output power configuration per FIG. 2B, impedances at ports P2 and P4 of the input coupler (110) configure such coupler to operate according to the Path3 of the first degenerative mode shown in FIG. 1D, and impedances at ports P3 and P4 of the output coupler (120) configure such coupler to operate according to the Path2 of the second degenerative mode shown in FIG. 1E. Furthermore, the person skilled in the art would clearly understand that any of the configurations described above with reference to FIGS. 3A, 3B and 3C may be used for activation and deactivation of the amplifier (130b). Finally, a person skilled in the art would clearly understand that any of the reduced output power configurations shown in FIG. 2A and FIG. 2B can be applied on the prior art configuration of FIG. 1A. In other words, according to an embodiment of the present disclosure, either one of the two amplifiers (130a) or (130b) may be deactivated for provision of a reduced power output mode of operation according to the present disclosure.

Figure 4A:
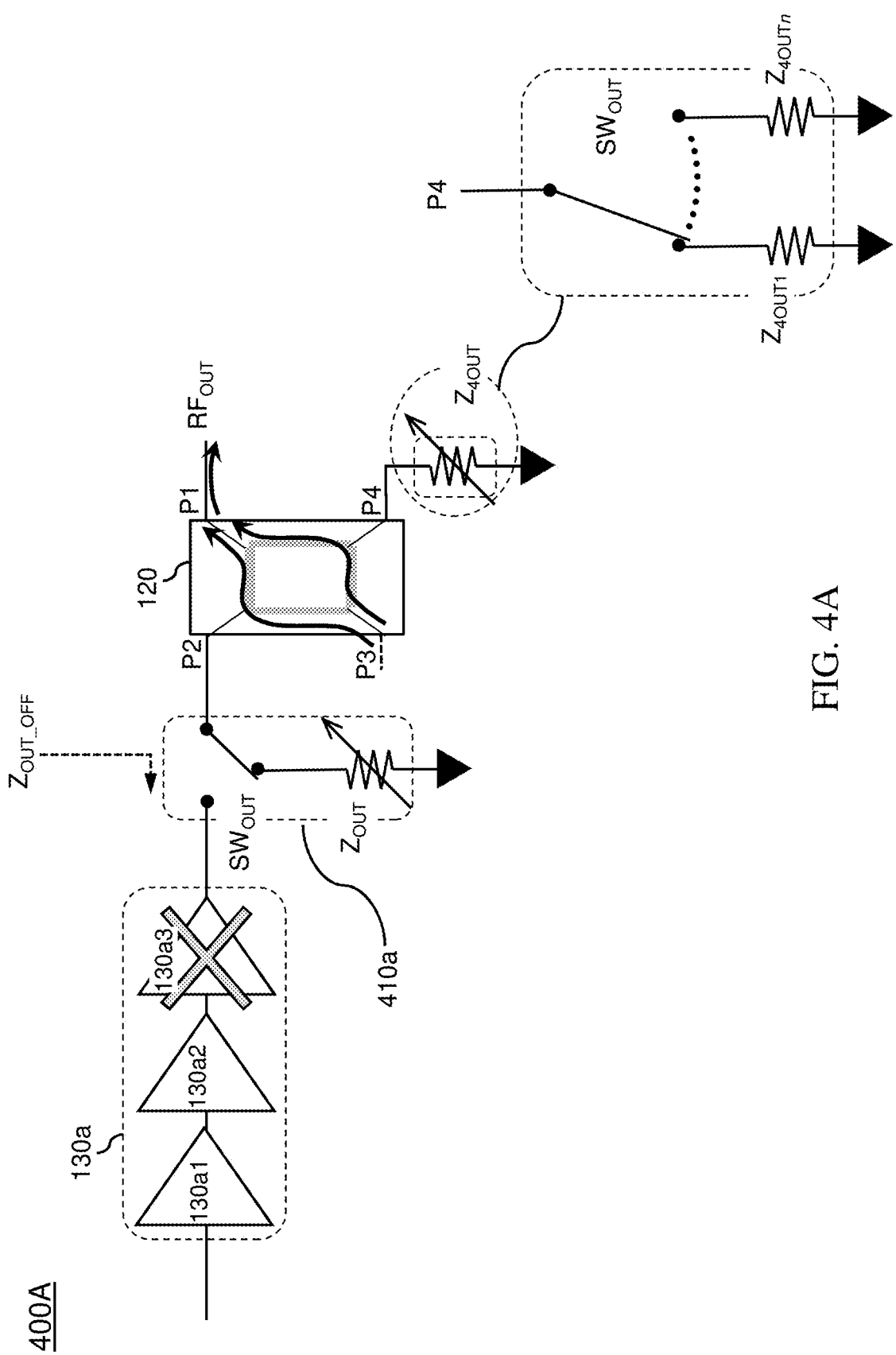
FIG. 4A shows an exemplary configuration according to the present disclosure of impedance switching that can be used in an output coupler of the configurations shown in FIG. 2A and/or FIG. 2B.

FIG. 4A shows an exemplary configuration (400A) according to the present disclosure of impedance switching that can be used to present different impedances to an output coupler (120) of the configurations shown in FIG. 2A and/or FIG. 2B. In particular, FIG. 4A shows a switchable impedance (410a) coupled to a port (e.g., P2, Amplifier_A-port) of the output coupler (120). As can be seen in FIG. 4A, the switchable impedance (410a) may include a (SPDT) switch, $SW_{OUT}$, coupled at a switching terminal of the switch $SW_{OUT}$ to the port (e.g., P2, Amplifier_A-port) of the output coupler (120), at a first throw of the switch $SW_{OUT}$ to an output node of an amplifier (e.g., 130a), and at a second throw of the switch $SW_{OUT}$ to an impedance, $Z_{OUT}$. Furthermore, as shown in FIG. 4A, an adjustable/configurable impedance, $Z_{4OUT}$, is coupled to port P4 (e.g., isolated/terminated port) of the output coupler (120). Such impedance switching according to the present disclosure may allow switching of different impedances to the ports (e.g., 2 and 4) of the output coupler (120) when operating according to the reduced output power mode of FIG. 2A (or FIG. 2B). Configuration control for the impedance switching may be provided via control lines (not shown) originating from a signal/configuration aware controller, such as, for example, a transceiver. It should be noted that as known to a person skilled in the art, an impedance, such as $Z_{OUT}$ or $Z_{4OUT}$, may be a purely resistive, purely reactive, or a combination of thereof.

With continued reference to FIG. 4A, an effective impedance $Z_{OUT\_OFF}$ coupled to an Amplfier_A-port (e.g., P2 per FIG. 4A) associated with a deactivated amplifier (e.g., 130a) can be set to other than an output impedance of the deactivated amplifier (e.g., 130a), thereby controlling operation of the output coupler (e.g., 120) according to any of the modes described above with reference to FIG. 1D or FIG. 1E. For example, assuming that the reduced output power mode of operation is provided via deactivating the amplifier (130a) as shown in FIG. 4A, then, during operation in the reduced output power mode, the switch $SW_{OUT}$ couples the port P2 (Amplifier_A-port) of the output coupler (120) to the impedance, $Z_{OUT}$; and during operation in the normal mode (higher output power), the switch $SW_{OUT}$ couples the port P2 (Amplifier_A-port) of the output coupler (120) to the output of the amplifier (130a). Furthermore, the controller (e.g., transceiver) may control the adjustable/configurable impedance, $Z_{4OUT}$, to provide different impedances between operation in the normal mode and operation in the reduced output power mode. FIG. 4A shows additional detail for an exemplary implementation of the adjustable/configurable impedance, $Z_{4OUT}$, including a single-pole multiple-throw switch $SW_{OUT}$ that is configured to selectively couple one of a plurality (e.g., integer number n) of fixed impedances ($Z4_{OUT1}, \ldots Z_{4OUTn}$) to the isolated/terminated port (i.e., port P4) of the output coupler (120). It should be noted that such fixed impedances may include a short and/or an open.

According to an exemplary embodiment of the present disclosure, the impedance, $Z_{OUT}$ may also be adjustable/configurable (e.g., per detail of $Z_{4OUT}$ shown in FIG. 4A). In other words, during operation in the reduced output power mode, operation (e.g., RF response) of the output coupler (120) may be controlled by adjusting an impedance value presented at the Amplifier_A-port (e.g., port P2). Additionally, or in the alternative, during operation in the reduced output power mode, operation (e.g., RF response) of the output coupler (120) may be controlled by adjusting an impedance value of $Z_{4OUT}$ presented at the isolated/terminated port (i.e., port P4). As described above, adjusting/configuring of the impedances presented at the Amplifier_A-port and the isolated/terminated port of the coupler may be used to provide different RF responses of the output coupler (120) as shown in FIGS. 5C and 5D later described. According to some exemplary embodiments of the present disclosure, such adjusting/configuring may be in view of, for example, a desired linear or inversely proportional relationship between respective impedance magnitudes. It should be noted that although the above description with reference to FIG. 4A is exemplified with relation to the reduced output power configuration shown in FIG. 2A, same description equally applies to the reduced output power configuration shown in FIG. 2B by replacing the amplifier (130a) with the amplifier (130b) and the port P2 (Amplifier_A-port) with the port P3 (Amplifier_B-port).

Figure 4B:
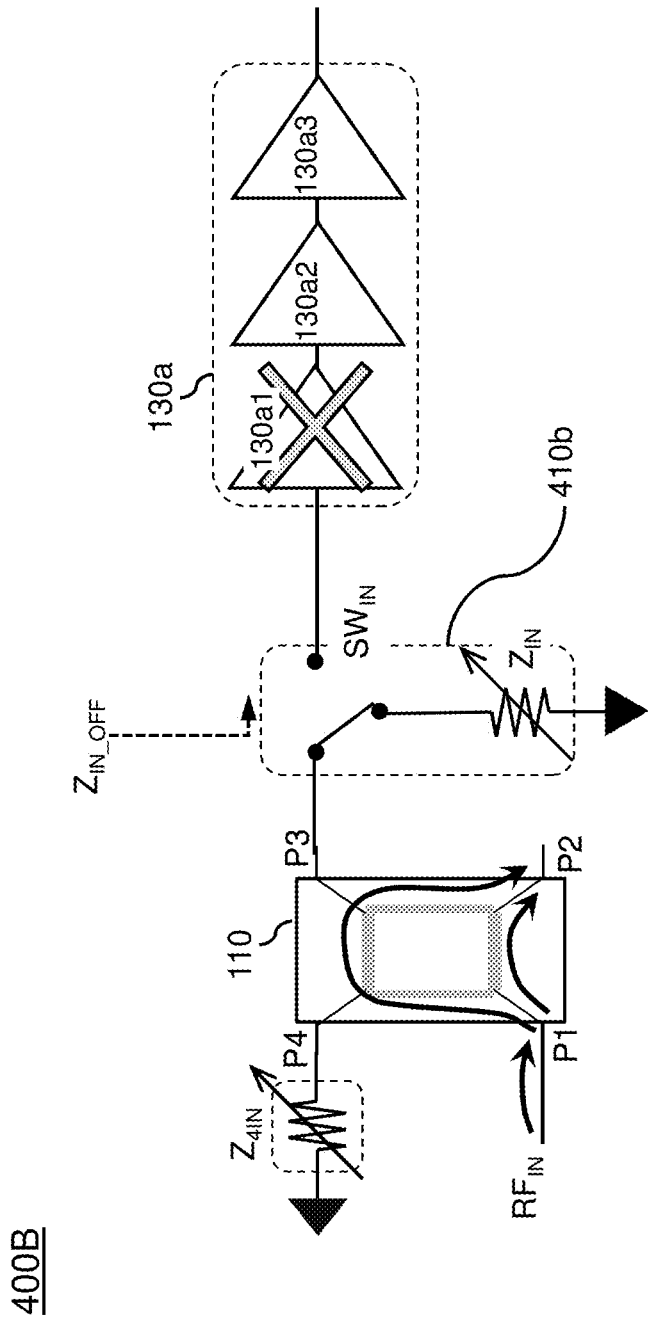
FIG. 4B shows an exemplary configuration according to the present disclosure of impedance switching that can be used in an input coupler of the configurations shown in FIG. 2A and/or FIG. 2B.

FIG. 4B shows an exemplary configuration (400B) according to the present disclosure of impedance switching that can be used to present different impedances to an input coupler (110) of the configurations shown in FIG. 2A and/or FIG. 2B. In particular, FIG. 4B shows a switchable impedance (410b) coupled to a port (e.g., P3, Amplifier_B-port) of the input coupler (110) and an adjustable/configurable impedance, $Z4_{IN}$ that is coupled to port P4 (e.g., isolated/terminated port) of the input coupler (110). A person skilled in the art would clearly see parallels between the configuration (400B) shown in FIG. 4B and the configuration (400A) described above with reference to FIG. 4A and clearly realize that the configuration (400B) is the dual of the configuration (400A) applicable to the input coupler (110). Accordingly, description related to FIG. 4A can be applied to FIG. 4B, mutatis mutandis.

Figure 4C:
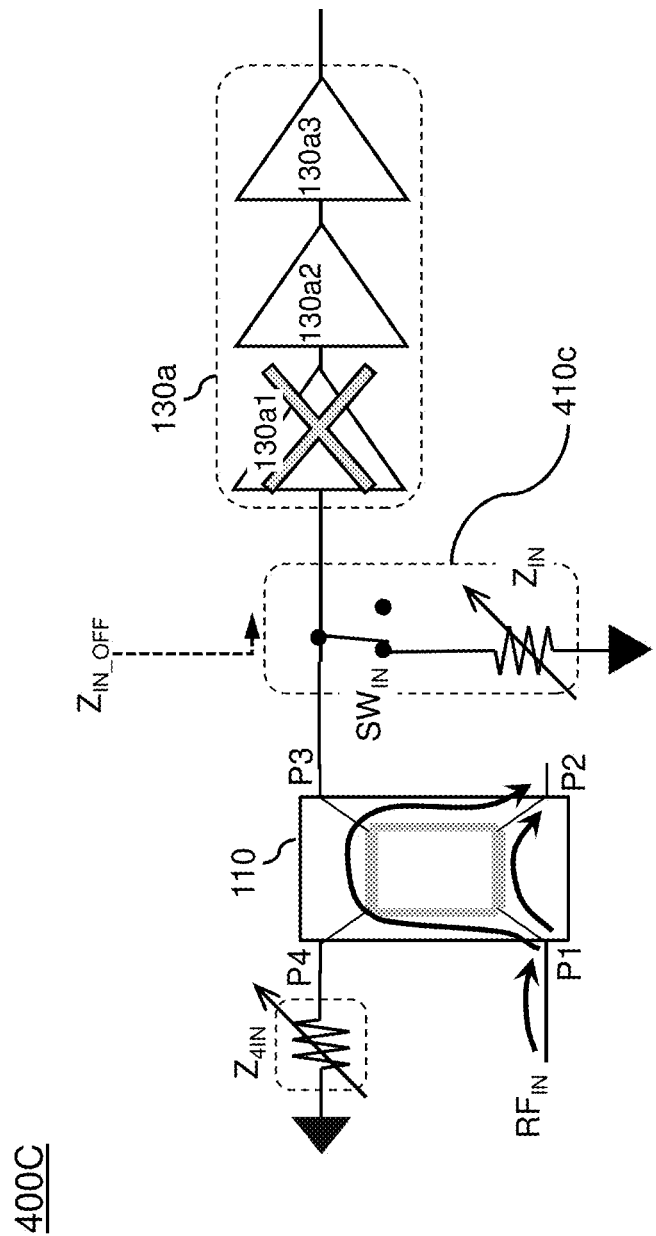
FIG. 4C shows another exemplary configuration according to the present disclosure of impedance switching that can be used in an input coupler of the configurations shown in FIG. 2A and/or FIG. 2B.

FIG. 4C shows yet another exemplary configuration (400C) according to the present disclosure of impedance switching that can be used to present different impedances to an input coupler (110), as well to an output coupler (120), of the configurations shown in FIG. 2A and/or FIG. 2B. In particular, FIG. 4C shows a switchable impedance (410c) coupled to a port (e.g., P3, Amplifier_B-port) of the input coupler (110) and an adjustable/configurable impedance, $Z_{4IN}$ that is coupled to port P4 (e.g., isolated/terminated port) of the input coupler (110). The switching impedance configuration shown in FIG. 4C is different from ones shown in FIGS. 4A and 4B in that, in the configuration of FIG. 4C, a coupling between a port (e.g., P3) of the coupler (e.g., 110) and a corresponding amplifier (e.g., 130a) is maintained in both modes (e.g., the normal and reduced output power) of operation, and impedance switching is provided by (selectively) coupling an impedance (e.g., $Z_{IN}$) at a node that connects the amplifier to the coupler via an SPDT switch, $SW_{IN}$. As clearly understood by a person skilled in the art, such selective coupling of the impedance (e.g., $Z_{IN}$) can be performed to an input of the deactivated amplifier (e.g., 130a) irrespective of an activated or deactivated state of a corresponding input stage (e.g., 130a1) of the amplifier. On the other hand, an impedance switching according to the configuration of FIG. 4C may only be used at an output of the deactivated amplifier (e.g., 130a) if deactivation of such amplifier includes deactivating of its output stage (e.g., 130a3). The impedance switching configuration shown in FIG. 4C switches impedance presented to a port (e.g., P2 and/or P3) of a coupler (e.g., input and/or output) by introducing (a shunted) impedance at a node that connects the port of the coupler to the amplifier. In other words, an effect of the switched impedance is to present an effective impedance to the port of the coupler that is a combination of an impedance presented by the amplifier and the switched impedance.

Based on FIGS. 4A, 4B and 4C, adjusting/configuring of the impedances presented at the Amplifier_A-port and/or Amplifier_B-port, and the isolated/terminated port, of any one of the input and/or output coupler (110, 120) may be used to provide different RF responses of the balanced amplifier configuration according to the present disclosure when operating in reduced output power mode. Such different RF responses may be provided by individually adjusting RF response of the input coupler (110) and/or of the output coupler (120), wherein a combined effect of such adjusting is observed at the output port P1 of the output coupler (120).

Figure 5A:
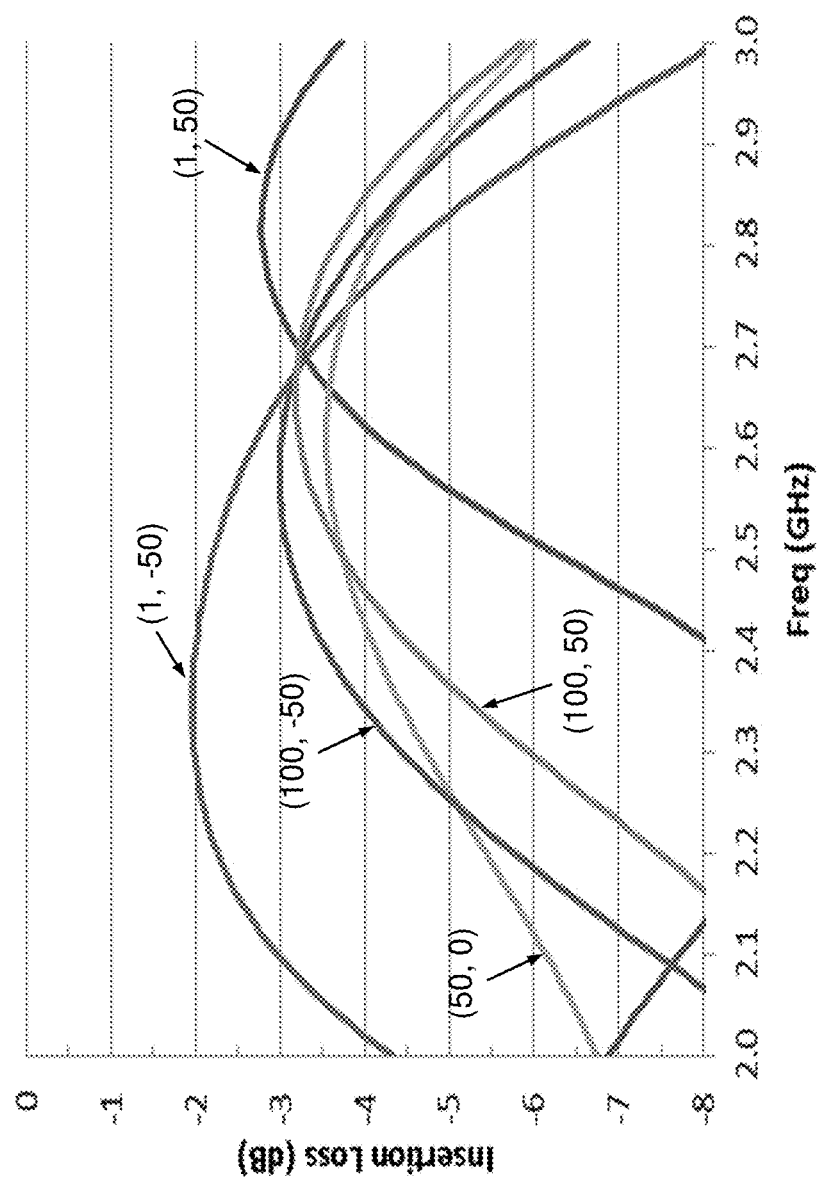
FIG. 5A shows graphs representative of an insertion loss as a function of frequency for different impedances coupled to an unused port of the input coupler of the balanced amplifier shown in FIG. 2A.
Figure 5B:
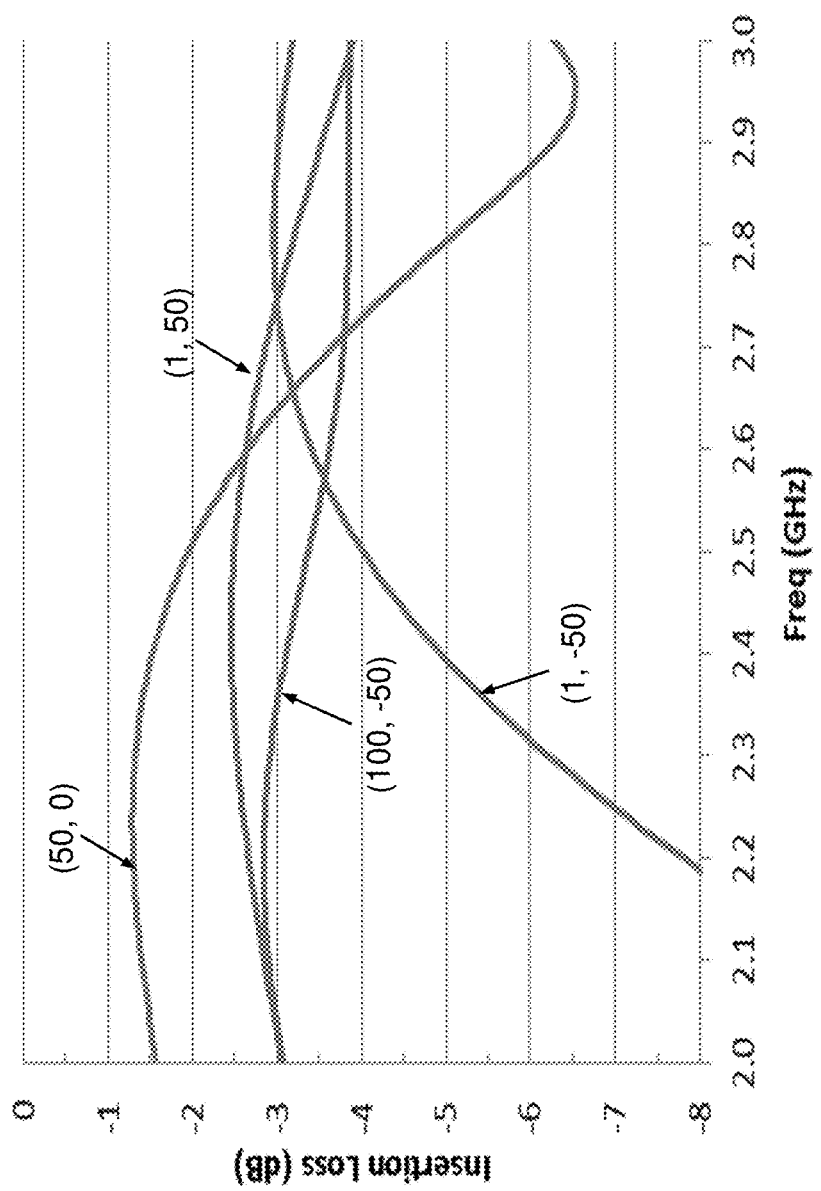
FIG. 5B shows graphs representative of an insertion loss as a function of frequency for different impedances coupled to an unused port of the input coupler of the balanced amplifier shown in FIG. 2B.
Figure 5C:
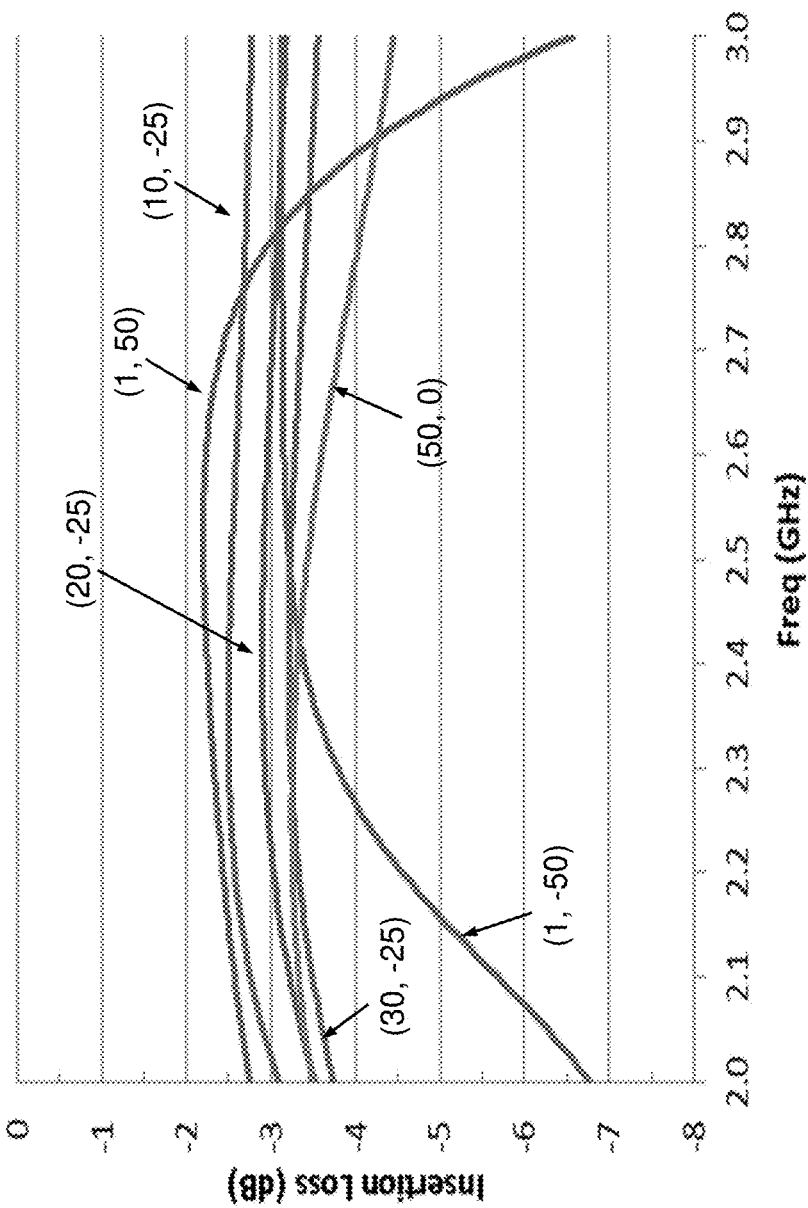
FIG. 5C shows graphs representative of an insertion loss as a function of frequency for different impedances coupled to an unused port of the output coupler of the balanced amplifier shown in FIG. 2B.
Figure 5D:
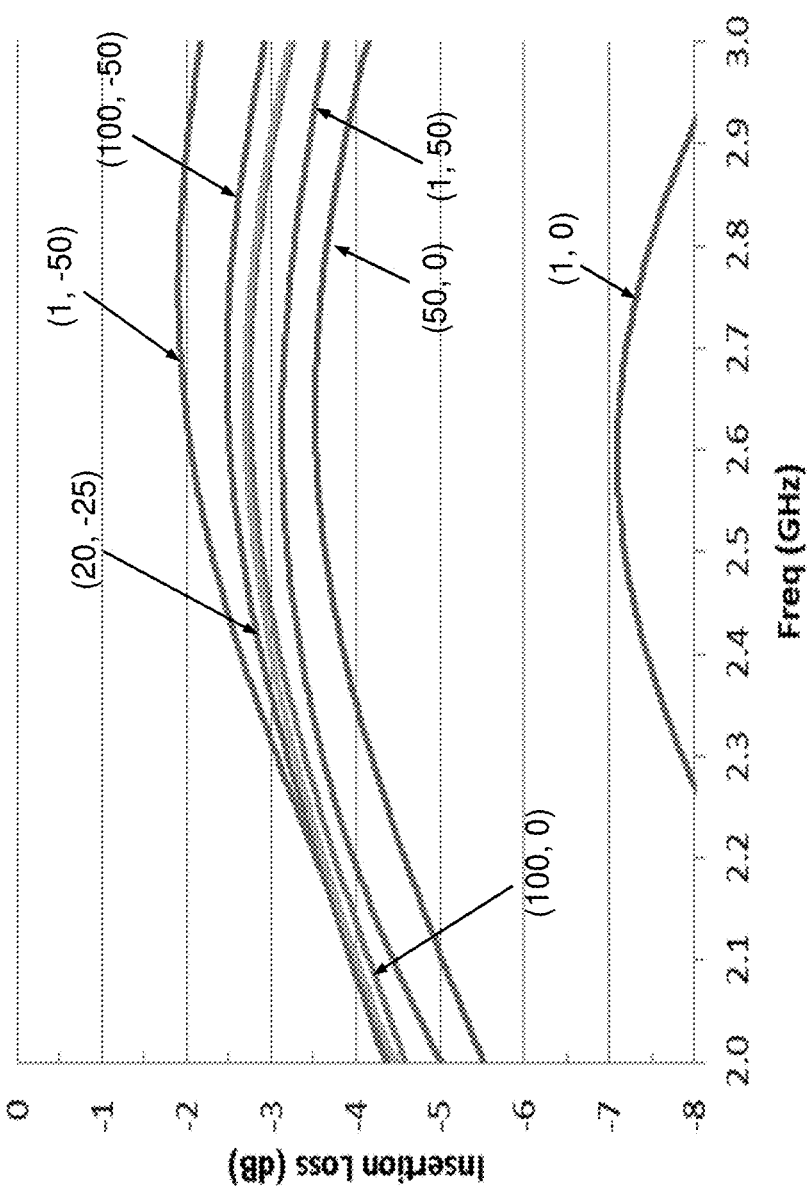
FIG. 5D shows graphs representative of an insertion loss as a function of frequency for different impedances coupled to an unused port of the output coupler of the balanced amplifier shown in FIG. 2A.

FIGS. 5A and 5B show graphs representative of effects on RF response (e.g., insertion loss vs. frequency) of the input coupler (110) for Path2 (e.g., FIG. 2A) and Path3 (e.g., FIG. 2B) configurations for different values impedances at the isolated/terminated port P4 of the input coupler (110). Likewise, FIGS. 5C and 5D show graphs representative of effects on RF response (e.g., insertion loss vs. frequency) of the output coupler (120) for Path2 (e.g., FIG. 2B) and Path3 (e.g., FIG. 2A) configurations for different values impedances at the isolated/terminated port P4 of the output coupler (120). As can be clearly taken from these figures, adjustment of impedance values ($Z_{4IN}$, $Z_{4OUT}$) seen at the isolated/terminated port P4 for each of the input and output couplers (110, 120) shown in FIGS. 2A and 2B can be used to affect/tune a frequency response of the balanced amplifier configuration according to the present teachings when operating in the reduced output power mode. Such tuning may include, for example, i) tuning to reduce sensitivity in amplitude response of one or both couplers with respect to (unintentional) varying of the impedance value at the port P4 (e.g., due to for example uncontrollable parameters such as process/temperature/other variation), or ii) control RF amplitude output by a path (e.g., Path2 and/or Path3), or iii) any other equalizing of the RF response based on design goals. It should be noted that although not included, additional graphs may be generated representing effects on RF response of the input/output couplers (110, 120) for Path2 and Path3 configurations for different values impedances at the P2 and P3 ports (Amplifier_A-port and Amplifier_B-port) of the input/output couplers (110, 120).

Figure 6:
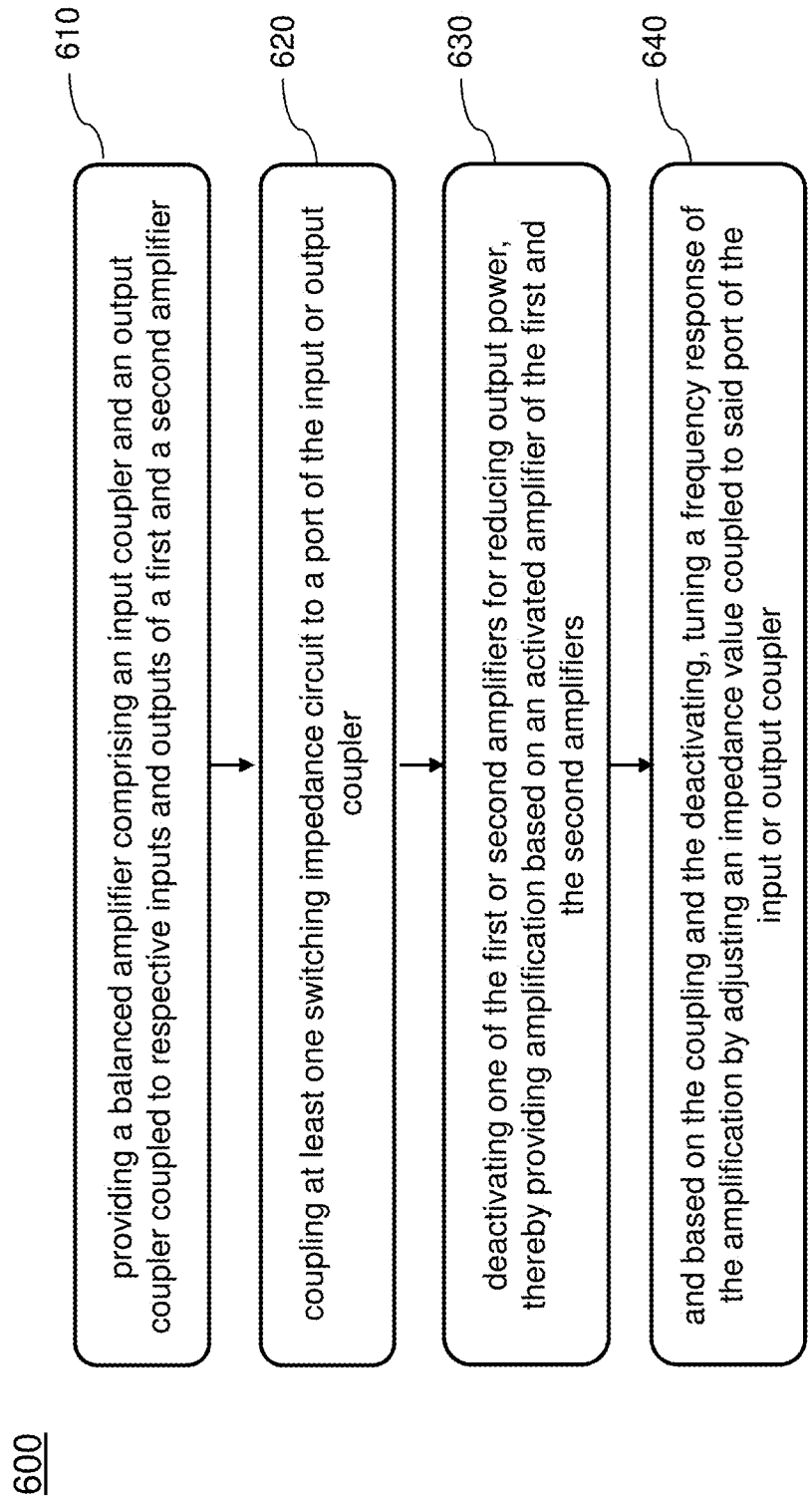
FIG. 6 is a process chart showing various steps of a method for reducing power of a balanced amplifier according to an embodiment of the present disclosure.

FIG. 6 is a process chart (600) showing various steps of a method for reducing output power of a balanced amplifier. As can be seen in FIG. 6, such steps comprise: providing a balanced amplifier comprising an input coupler and an output coupler coupled to respective inputs and outputs of a first and a second amplifier, per step (610); coupling at least one switching impedance circuit to a port of the input or output coupler, per step (620); deactivating one of the first or second amplifiers for reducing output power, thereby providing amplification based on an activated amplifier of the first and the second amplifiers, per step (630); and based on the coupling and the deactivating, tuning a frequency response of the amplification by adjusting an impedance value coupled to said port of the input or output coupler, per step (640).

It should be noted that the various embodiments of the balanced amplifier configuration according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. An amplifier arrangement configured to operate according to a first mode of operation and a second mode of operation, the amplifier arrangement comprising:
    a first amplifier comprising an input and an output;
    a second amplifier comprising an input and an output;
    an input coupler comprising an input port, an input terminated port, and respective amplifier input ports coupled to respective inputs of the first and the second amplifier;
    an output coupler comprising an output port, an output terminated port, and respective amplifier output ports coupled to respective outputs of the first and the second amplifier;
    wherein during the first mode of operation:
        the first and the second amplifiers are activated and the amplifier arrangement is configured to operate as a balanced amplifier for amplification of an input RF signal provided at the input port of the input coupler and generation therefrom of an output RF signal provided at the output port of the output coupler, and
    wherein during the second mode of operation:
        one of the first and second amplifiers is deactivated and the other one of the first and second amplifiers is activated, and the amplifier arrangement is configured to operate as a single-ended amplifier for amplification of the input RF signal provided at the input port of the input coupler via the activated amplifier and generation therefrom of the output RF signal provided at the output port of the output coupler, and
        an impedance coupled to a switching impedance port of the input coupler, or of the output coupler, is adjusted such that a magnitude of an adjusted impedance at the switching impedance port is linear or inversely proportional to a magnitude of an impedance at a deactivated amplifier port of the input coupler or the output coupler,
        wherein the switching impedance port comprises the input terminated port or the output terminated port, and
            wherein the deactivated amplifier port comprises the respective amplifier input port associated to the deactivated amplifier or the respective amplifier output port associated with the deactivated amplifier.

2. The amplifier arrangement according to claim 1, wherein adjustment of said impedance is based on a desired frequency response of the amplifier arrangement during operation in the second mode.

3. The amplifier arrangement according to claim 1, wherein adjustment of said impedance is provided by a switching impedance circuit that includes a switch configured to selectively couple a terminating impedance to the switching impedance port.

4. The amplifier arrangement according to claim 3, wherein the terminating impedance has a variable impedance value.

5. The amplifier arrangement according to claim 3, wherein the switch is a single-pole multi-throw switch that is configured to selectively couple one or more additional terminating impedances to the switching impedance port.

6. The amplifier arrangement according to claim 3, wherein
    during the second mode of operation, the switch decouples the respective amplifier input port or the respective amplifier output port from the deactivated amplifier.

7. The amplifier arrangement according to claim 1, wherein
    deactivation of the deactivated amplifier comprises reduction of a DC power to the deactivated amplifier.

8. The amplifier arrangement according to claim 7, wherein
    each of the first amplifier and the second amplifier comprises a plurality of cascaded amplification stages, and
    the reduction of the DC power comprises removal of the DC power to at least one stage of the plurality of cascaded amplification stages.

9. The amplifier arrangement according to claim 8, wherein
    the removal of the DC power is provided via a switch that is configured to selectively decouple DC power from the at least one stage independently from other stages.

10. The amplifier arrangement according to claim 8, wherein
    the at least one stage is an input stage of the plurality of cascaded amplification stages.

11. The amplifier arrangement according to claim 8, wherein
    the at least one stage is an output stage of the plurality of cascaded amplification stages.

12. The amplifier arrangement according to claim 8, wherein
    the at least one stage is an input stage and an output stage of the plurality of cascaded amplification stages.

13. The amplifier arrangement according to claim 1, wherein
    deactivation of the deactivated amplifier comprises removal of the DC power to the deactivated amplifier.

14. The amplifier arrangement according to claim 1, wherein each of the input coupler and the output coupler comprises one of a branch-line coupler or a hybrid coupler.

15. The amplifier arrangement according to claim 1, wherein the amplifier arrangement is monolithically integrated.

16. The amplifier arrangement according to claim 15, wherein the amplifier arrangement is monolithically integrated by using a fabrication technology comprising one of: a) silicon-on-insulator (SOI) technology, and b) silicon-on-sapphire technology (SOS).

17. An electronic module comprising the amplifier arrangement according to claim 15.

18. A phase array element comprising the amplifier arrangement according to claim 15.

19. A method for reducing output power of a balanced amplifier, the method comprising:
providing a balanced amplifier comprising an input coupler and an output coupler coupled to respective inputs and outputs of a first and a second amplifier;
coupling at least one switching impedance circuit to a switching impedance port of the input coupler or of the output coupler;
deactivating one of the first or second amplifiers for reducing output power, thereby providing amplification based on an activated amplifier of the first and the second amplifiers; and
based on the coupling and the deactivating, tuning a frequency response of the amplification by adjusting an impedance value coupled to said switching impedance port such that a magnitude of an adjusted impedance at the switching impedance port is linear or inversely proportional to a magnitude of an impedance at a deactivated amplifier port of the input coupler or the output coupler,
wherein
the input coupler comprises an input port, an input terminated port, and respective amplifier input ports coupled to respective inputs of the first and the second amplifier,
the output coupler comprises an output port, an output terminated port, and respective amplifier output ports coupled to respective outputs of the first and the second amplifier;
the switching impedance port comprises the input terminated port or the output terminated port, and
the deactivated amplifier port comprises the respective amplifier input port associated to a deactivated amplifier or the respective amplifier output port associated to the deactivated amplifier.

20. A phase array element, comprising:
an amplifier arrangement configured to operate according to a first mode of operation and a second mode of operation, the amplifier arrangement comprising:
a first amplifier comprising an input and an output;
a second amplifier comprising an input and an output;
an input coupler comprising an input port, an input terminated port, and respective amplifier input ports coupled to respective inputs of the first and the second amplifier;
an output coupler comprising an output port, an output terminated port, and respective amplifier output ports coupled to respective outputs of the first and the second amplifier;
wherein during the first mode of operation:
the first and the second amplifiers are activated and the amplifier arrangement is configured to operate as a balanced amplifier for amplification of an input RF signal provided at the input port of the input coupler and generation therefrom of an output RF signal provided at the output port of the output coupler, and
wherein during the second mode of operation:
one of the first and second amplifiers is deactivated and the other one of the first and second amplifiers is activated, and the amplifier arrangement is configured to operate as a single-ended amplifier for amplification of the input RF signal provided at the input port of the input coupler via the activated amplifier and generation therefrom of the output RF signal provided at the output port of the output coupler, and
an impedance coupled to a switching impedance port of the input or output coupler is adjusted, the first switching impedance port comprising one of:
the input or output terminated port, or
the respective amplifier input port or the respective amplifier output port associated with the deactivated amplifier,
wherein the amplifier arrangement is monolithically integrated.

* * * * *